United States Patent
Cleavelin et al.

(10) Patent No.: US 7,793,186 B1
(45) Date of Patent: Sep. 7, 2010

(54) SYSTEM AND METHOD FOR INCREASING THE EXTENT OF BUILT-IN SELF-TESTING OF MEMORY AND CIRCUITRY

(75) Inventors: Cloves R. Cleavelin, Dallas, TX (US); Andrew Marshall, Dallas, TX (US); Stephanie W. Butler, Richardson, TX (US); Howard L. Tigelaar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/784,078

(22) Filed: May 20, 2010

Related U.S. Application Data

(62) Division of application No. 12/030,365, filed on Feb. 13, 2008, now Pat. No. 7,752,518.

(51) Int. Cl.
  *G11C 29/00* (2006.01)
  *G01R 31/28* (2006.01)

(52) U.S. Cl. .............. 714/733; 714/718; 714/727; 365/201

(58) Field of Classification Search ............ None
  See application file for complete search history.

(56) References Cited

U.S. PATENT DOCUMENTS

| | | | |
|---|---|---|---|
| 4,695,949 A * | 9/1987 | Thatte et al. ............... 1/1 |
| 6,011,734 A | 1/2000 | Pappert | |
| 2003/0167427 A1 | 9/2003 | Kraus et al. | |
| 2004/0093540 A1 | 5/2004 | Adams et al. | |
| 2004/0268198 A1 | 12/2004 | Ouellette et al. | |
| 2005/0283657 A1 * | 12/2005 | Nishihara ............ 714/8 |
| 2006/0083085 A1 | 4/2006 | Ikegami | |
| 2009/0049257 A1 * | 2/2009 | Khatri et al. ............ 711/161 |

\* cited by examiner

*Primary Examiner*—Jeffrey A Gaffin
*Assistant Examiner*—Guerrier Merant
(74) *Attorney, Agent, or Firm*—Rose Alyssa Keagy; W. James Brady; Frederick J. Telecky, Jr.

(57) ABSTRACT

An integrated circuit (IC), a method of testing an IC and a method of reading test results from an IC containing built-in self-test (BIST) circuitry. In one embodiment, the IC includes: (1) an external test bus interface, (2) read-write memory coupled to the external test bus interface, (3) other circuitry and (4) BIST circuitry, coupled to the external test bus interface, the read-write memory and the other circuitry and configured to test the read-write memory to identify a good data block therein, store in a predetermined data block in the read-write memory multiple instances of a pointer to the good data block, conduct a test of at least the other circuitry and store at least some results of the test in the good data block.

6 Claims, 1 Drawing Sheet

SYSTEM AND METHOD FOR INCREASING THE EXTENT OF BUILT-IN SELF-TESTING OF MEMORY AND CIRCUITRY

CROSS-REFERENCE TO RELATED APPLICATIONS

This is a division of pending application Ser. No. 12/030,365, filed on Feb. 13, 2008, the entire disclosure of which is hereby incorporated by reference.

TECHNICAL FIELD OF THE INVENTION

The invention is directed, in general, to built-in self-testing (BIST) and, more specifically, to a system and method for increasing the extent to which BIST can be carried out with respect to memory and circuitry.

BACKGROUND OF THE INVENTION

Testing fabricated integrated circuits (ICs) to identify defects and determine proper operation has always been a difficult problem. IC manufacturers must detect and correct such defects before shipping large numbers of parts to customers to avoid a costly recall.

IC defects occur in two major categories. Design defects arise when the design of an IC is incapable of performing the function for which the IC is intended. ICs properly manufactured according to a defective design nonetheless function defectively. Design defects affect every IC until the design itself is changed. A manufacturing defect involves some fault in the manufacture of the IC and typically affects fewer than all parts manufactured. Such defects are corrected by identification and correction of the manufacturing fault.

Most IC manufacturers test ICs for proper function before shipping them to customers. With the increase in IC complexity this testing becomes increasingly difficult. Rather than rely on increasingly expensive external testing devices, many manufacturers have begun to test ICs using a technique called "built-in self-test" (BIST). BIST uses circuitry that co-exists on the same substrate as an IC to test the IC. When triggered either automatically in circuit operation or by an external test device, the BIST circuitry produces a set of test conditions that run on other, ordinary IC circuitry. Comparison of the state of the IC following test to an expected state indicates whether the IC passed the test. An example of such a test is writing to a read-write memory and recalling the data written. A match between the data written and the data read results in passing the test.

BIST typically involves other more complex tests and relies on an external test bus to report results to the external test device. Popular external test bus standards include the well-known Inter-Integrated Circuit, or I2C, bus. BIST is therefore a process of loading test instructions or data from the external test device to BIST circuitry via the external test bus, causing the BIST circuitry to conduct tests and reading test results via the external test bus.

While an external test bus provides satisfactory speeds for loading the test data and reading the test results, an improvement in testing speed, without sacrificing completeness or accuracy, is desired. What is needed in the art is a faster way to test an IC such that IC defects can be detected more effectively.

SUMMARY OF THE INVENTION

To address the above-discussed deficiencies of the prior art, one aspect of the invention provides an IC. In one embodiment, the IC includes: (1) an external test bus interface, (2) read-write memory coupled to the external test bus interface, (3) other circuitry and (4) BIST circuitry, coupled to the external test bus interface, the read-write memory and the other circuitry and configured to test the read-write memory to identify a good data block therein, store in a predetermined data block in the read-write memory multiple instances of a pointer to the good data block, conduct a test of at least the other circuitry and store at least some results of the test in the good data block.

Another aspect of the invention provides a method of testing an IC. In one embodiment, the method includes: (1) testing read-write memory in the IC to identify a good data block therein, (2) storing in a predetermined data block in the read-write memory multiple instances of a pointer to the good data block, (3) conducting a test of at least the other circuitry and (4) storing at least some results of the test in the good data block.

Yet another aspect of the invention provides a method of reading test results from an IC containing BIST circuitry. In one embodiment, the method includes: (1) gaining access to read-write memory in the IC via an external test bus interface thereof, (2) reading from a predetermined data block of the read-write memory multiple instances of a pointer to a good data block of the read-write memory, (3) analyzing the multiple instances to identify the good data block and (4) reading at least some results of a test of at least some other circuitry of the IC contained in the good data block.

The foregoing has outlined certain aspects and embodiments of the invention so that those skilled in the pertinent art may better understand the detailed description of the invention that follows. Additional aspects and embodiments will be described hereinafter that form the subject of the claims of the invention. Those skilled in the pertinent art should appreciate that they can readily use the disclosed aspects and embodiments as a basis for designing or modifying other structures for carrying out the same purposes of the invention. Those skilled in the pertinent art should also realize that such equivalent constructions do not depart from the scope of the invention.

BRIEF DESCRIPTION OF THE DRAWINGS

For a more complete understanding of the invention, reference is now made to the following descriptions taken in conjunction with the accompanying drawings, in which.

DETAILED DESCRIPTION

Figure 1:
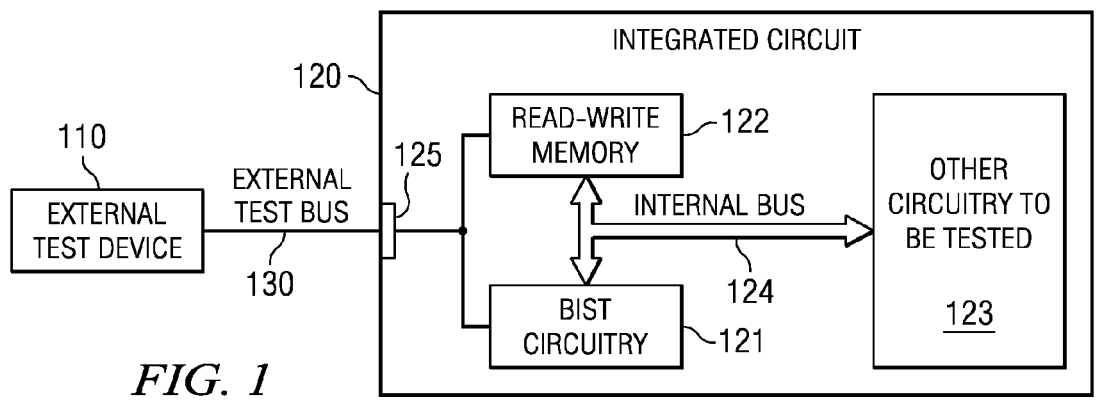
FIG. 1 illustrates a block diagram of a device-under-test coupled to an external test device and containing a read-write memory and one embodiment of a system for increasing the extent to which BIST can be carried out with respect to memory and circuitry constructed according to the principles of the invention.

FIG. 1 illustrates a block diagram an IC 120 that constitutes a device-under-test (DUT). The IC 120 contains BIST circuitry 121 (capable of performing one or more of a wide range of conventional or later-developed tests), read-write memory 122 (e.g., random-access or flash memory), other circuitry to be tested 123 and an internal bus 124 that couples the BIST circuitry 121, read-write memory 122 and other circuitry to be tested 123 together. The BIST circuitry 121 employs the read-write memory 122 at least to store results of the tests it performs.

An external test bus 130 couples the external test device 110 to the IC 120 via an external test interface 125 that is part of the IC 120. The external test bus 130 may be, for example, an I2C bus, although the invention is not limited to a particular type of bus. The internal bus 124 is assumed to be capable of supporting a significantly higher data rate than the external test bus 130, which is almost always the case. FIGURE schematically indicates this disparity by representing the internal bus 124 with a line that is thicker than that of the external test bus 130.

In the illustrated embodiment, the other circuitry to be tested 123 includes circuitry that carries out the functions an end-user ordinarily desires the IC 120 to perform over its life. In that capacity, the other circuitry to be tested 123 employs the read-write memory 122 to store instructions or data. The BIST circuitry 121, on the other hand, is intended to be employed only in testing during manufacturing of the IC 120. However, in other embodiments, the BIST circuitry 121 may be employed to test the IC 120 during later stages of the life of the IC 120.

As described above, BIST is a process of loading test instructions or data from the external test device 110 into the BIST circuitry 121 via the external test bus 130, causing the BIST circuitry 121 to conduct tests and store results in the read-write memory 122 and reading test results from the read-write memory 122 via the external test bus 130. To ensure completeness, it is necessary to test all three of the other circuitry to be tested 123, the read-write memory 122 and the internal bus 124.

Since the BIST circuitry 121 conducts the BIST and employs the read-write memory 122 to store test results, testing the BIST circuitry 121 and read-write memory 122 and confirming their proper operation before undertaking any BIST has been regarded as necessary. It has therefore been the practice to employ the external test device 110 and the external test bus 130 to test and confirm the BIST circuitry 121 and the entirety of the read-write memory 122 as good before undertaking BIST. Unfortunately, since the external test bus 130 is relatively slow, overall test speed is compromised.

An advantageous way to increase overall test speed is to increase the extent to which BIST can be performed on the read-write memory 122 such that use of the external test bus 130 can be reduced. It has been realized that the BIST circuitry 121, rather than the external test device 110, can be used to test and confirm as good the read-write memory 122. It has been further realized that it is not necessary to confirm as good the entirety of the read-write memory 122 before performing BIST on the remainder of the IC 120; it is only necessary to confirm as good a data block in the read-write memory 122 that is of sufficient size to contain the test results before further BIST can take place.

Therefore, once the external test device 110 has tested and confirmed as good the BIST circuitry 121, the BIST circuitry 121 can begin to test one data block after another in the read-write memory 122 with the goal of identifying a good data block therein. In the illustrated embodiment, the BIST circuitry 121 tests data blocks other than the lowest data block (the data block encompassing the lowest addresses). Assuming that the BIST circuitry 121 identifies a good data block, it then should disclose the identity of that good data block to the external test device 110.

Accordingly, the BIST circuitry 121 stores multiple instances of a pointer (i.e., an address) to the good data block in a predetermined data block (i.e., a data block that the external test device has been preconfigured to read) in the read-write memory 122. Multiple instances of the pointer allow the external test device 110 to analyze the instances such that it can still identify the good data block even if some of the instances of the pointer are corrupt (typically due to defects in the predetermined data block). Once the BIST circuitry 121 has stored the multiple instances of the pointer, it may then conduct at least one test of at least the other circuitry 123 and perhaps other data blocks in the read-write memory 122 and store at least some (and perhaps all) results of the at least one test in the good data block.

In the illustrated embodiment, the predetermined data block is the lowest data block, and the BIST circuitry 121 is configured to store in the lowest data block at least 20 instances of the pointer. Twenty is an arbitrary number; the BIST circuitry 121 may be configured to store 50, 100 or any other number of instances of the pointer. The larger the number of instances, the greater the likelihood that the external test device 110 correctly locates the good data block.

Figure 2:
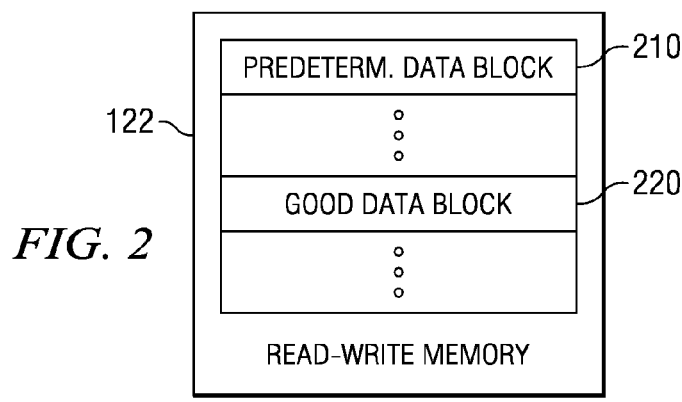
FIG. 2 schematically illustrates an addressable memory space contained within the read-write memory of FIG. 1.

Turning briefly to FIG. 2, schematically illustrated is an addressable memory space contained within the read-write memory 122 of FIG. 1. FIG. 2 is presented for the purpose of illustrating examples of the predetermined data block 210 and the good data block 220. FIG. 2 shows other portions of the addressable memory space to indicate that the read-write memory 122 is typically larger than just the predetermined data block 210 and the good data block 220.

Returning to FIG. 1, once the BIST circuitry 121 has completed BIST, it may then notify the external test device 110, whereupon the external test device 110 retrieves the multiple instances of the pointer from the predetermined data block, analyzes the multiple instances to identify the good data block, reads at least some (and perhaps all) of the test results from the good data block and determines from those test results whether or not the IC 120 contains manufacturing defects.

In the illustrated embodiment, the external test device determines a mode of the multiple instances, the mode identifying said good data block. As those skilled in the pertinent art understand, a mode is a statistical measure of frequency. Given a set of data values (e.g., multiple instances of a pointer), the mode is the particular data value that has the greatest number of occurrences. Because manufacturing defects in read-write memory are likely to affect one or a small number of locations, one or a small number of pointers will be incorrect. It is therefore expected that the mode of the multiple occurrences of the pointer will in fact be the correct value of the pointer.

The external test device 110 may regard a mode that is merely a plurality of multiple instances (e.g., 8 of 20) as adequate to identify the good data block. In the illustrated embodiment, the external test device 110 regards only a mode that includes a majority of the multiple instances (e.g., 11 of 20) as adequate to identify the good data block. Of course, if the external test device 110 upon analysis determines the mode to be inadequate, it may regard the IC 120 as containing a manufacturing defect.

Those skilled in the pertinent art should understand that the invention is not limited to a modal analysis and indeed encompasses any statistical or other analysis that would yield the identity of the good data block.

Figure 3A:
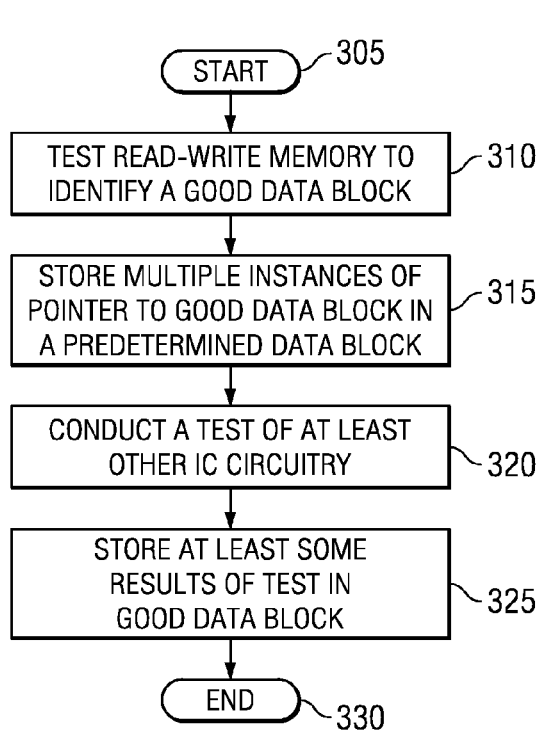
FIGS. 3A and 3B together illustrate flow diagrams of one embodiment of a method of increasing the extent to which BIST can be carried out with respect to memory and circuitry carried out according to the principles of the invention.
Figure 3B:
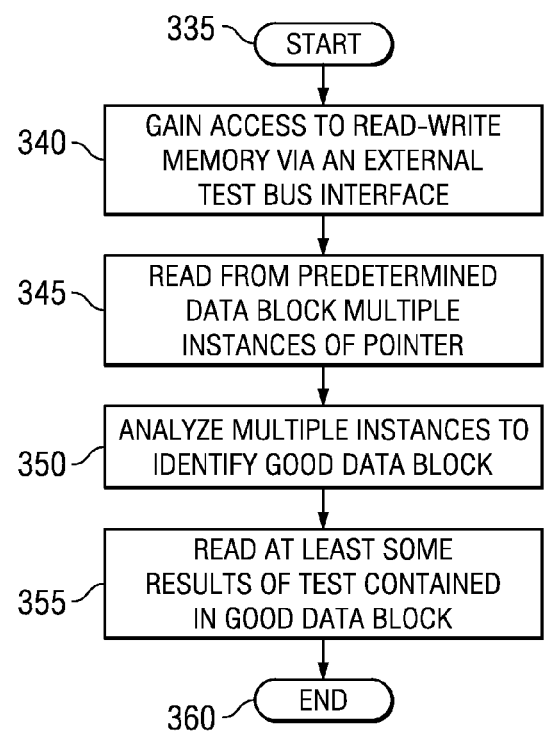

FIGS. 3A and 3B together illustrate flow diagrams of one embodiment of a method of increasing the extent to which BIST can be carried out with respect to memory and circuitry carried out according to the principles of the invention. The method has two parts: a method of testing an IC, illustrated in FIG. 3A, and a method of reading test results from an IC containing BIST circuitry. The method of FIG. 3A begins in a start step 305. In a step 310, read-write memory in the IC is tested to identify a good data block therein. In a step 315, multiple instances of a pointer to the good data block are stored in a predetermined data block in the read-write memory. In a step 320, a test of at least the other circuitry is conducted. In a step 325, at least some results of the test are stored in the good data block. The method ends in an end step 330.

The method of FIG. 3B begins in a start step 335. In a step 340, access to read-write memory in the IC is gained via an external test bus interface thereof. In a step 345, multiple instances of a pointer to a good data block of the read-write memory are read from a predetermined data block of the read-write memory. In a step 350, the multiple instances are analyzed to identify the good data block. In a step 355, at least some results of a test of at least some other circuitry of the IC contained in the good data block are read. The method ends in an end step 360.

Those skilled in the art to which the invention relates will appreciate that other and further additions, deletions, substitutions and modifications may be made to the described embodiments without departing from the scope of the invention.

What is claimed is:

1. A method of reading test results from an integrated circuit (IC) containing built-in self-test (BIST) circuitry, comprising:
   gaining access to read-write memory in said IC via an external test bus interface thereof;
   reading from a predetermined data block of said read-write memory multiple instances of a pointer to a good data block of said read-write memory;
   analyzing said multiple instances to identify said good data block; and
   reading at least some results of a test of at least some other circuitry of said IC contained in said good data block.

2. The method as recited in claim 1 wherein said reading comprises reading at least 20 instances of said pointer.

3. The method as recited in claim 1 wherein said predetermined data block is a lowest data block.

4. The method as recited in claim 1 wherein said analyzing comprises determining a mode of said multiple instances, said mode identifying said good data block.

5. The method as recited in claim 4 wherein said mode includes a majority of said multiple instances.

6. The method as recited in claim 1 wherein said external test bus interface is a Joint Test Action Group (JTAG) bus interface.

* * * * *